(12) United States Patent
Minami et al.

(10) Patent No.: US 10,796,921 B2
(45) Date of Patent: *Oct. 6, 2020

(54) CMP FLUID AND METHOD FOR POLISHING PALLADIUM

(75) Inventors: Hisataka Minami, Hitachi (JP); Ryouta Saisyo, Hitachi (JP); Jin Amanokura, Hitachi (JP); Yuuhei Okada, Hitachi (JP); Hiroshi Ono, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 548 days.

This patent is subject to a terminal disclaimer.

(21) Appl. No.: 13/377,457

(22) PCT Filed: Feb. 5, 2010

(86) PCT No.: PCT/JP2010/051671
§ 371 (c)(1),
(2), (4) Date: Dec. 9, 2011

(87) PCT Pub. No.: WO2011/007588
PCT Pub. Date: Jan. 20, 2011

(65) Prior Publication Data
US 2012/0100718 A1    Apr. 26, 2012

(30) Foreign Application Priority Data

Jul. 16, 2009 (JP) ................. 2009-167991
Oct. 8, 2009 (JP) ................. 2009-234561

(51) Int. Cl.
*H01L 21/321* (2006.01)
*C09G 1/02* (2006.01)

(52) U.S. Cl.
CPC ............ *H01L 21/3212* (2013.01); *C09G 1/02* (2013.01)

(58) Field of Classification Search
CPC ...... H01L 21/3212; H01L 2224/03616; C09G 1/02
(Continued)

(56) References Cited

U.S. PATENT DOCUMENTS 4,944,836 A  7/1990  Beyer et al.
6,527,622 B1  3/2003  Brusic et al.
(Continued)

FOREIGN PATENT DOCUMENTS

CN   1813038   8/2006
CN   1835212   9/2006
(Continued)

OTHER PUBLICATIONS

Notification of Transmittal of Translation of the International Preliminary Report on Patentability, dated Feb. 16, 2012, in corresponding PCT Application No. PCT/JP2010/051671.
(Continued)

*Primary Examiner* — Allan W. Olsen
*Assistant Examiner* — Margaret D Klunk
(74) *Attorney, Agent, or Firm* — Fitch, Even, Tabin & Flannery, L.L.P.

(57) ABSTRACT

The CMP polishing liquid for polishing palladium of this invention comprises an organic solvent, 1,2,4-triazole, a phosphorus acid compound, an oxidizing agent and an abrasive. The substrate polishing method is a method for polishing a substrate with a polishing cloth while supplying a CMP polishing liquid between the substrate and the polishing cloth, wherein the substrate is a substrate with a palladium layer on the side facing the polishing cloth, and the CMP polishing liquid is a CMP polishing liquid comprising an organic solvent, 1,2,4-triazole, a phosphorus acid compound, an oxidizing agent and an abrasive.

18 Claims, 4 Drawing Sheets

(58) Field of Classification Search
USPC .................................. 216/88–91; 438/690–693
See application file for complete search history.

(56) References Cited

U.S. PATENT DOCUMENTS

| | | | |
|---|---|---|---|
| 6,599,837 | B1 | 7/2003 | Merchant et al. |
| 6,971,945 | B2 | 12/2005 | Liu et al. |
| 8,101,864 | B2 | 1/2012 | Chinda et al. |
| 9,799,532 | B2 * | 10/2017 | Minami ................ B24B 37/044 |
| 2002/0039839 | A1 | 4/2002 | Thomas et al. |
| 2003/0181142 | A1 | 9/2003 | De Rege Thesauro et al. |
| 2004/0082275 | A1 * | 4/2004 | Mahulikar ............ B24B 37/044 451/41 |
| 2004/0266196 | A1 | 12/2004 | De Rege Thesauro et al. |
| 2005/0076580 | A1 | 4/2005 | Tamboli et al. |
| 2005/0104048 | A1 * | 5/2005 | Thomas et al. ............... 252/515 |
| 2005/0178742 | A1 | 8/2005 | Chelle et al. |
| 2005/0211950 | A1 * | 9/2005 | de Rege Thesauro et al. ............. 252/79.1 |
| 2006/0030158 | A1 * | 2/2006 | Carter et al. .................. 438/692 |
| 2006/0086055 | A1 | 4/2006 | Carter |
| 2006/0099817 | A1 | 5/2006 | Feller et al. |
| 2006/0225918 | A1 | 10/2006 | Chinda et al. |
| 2006/0234509 | A1 * | 10/2006 | Small et al. .................. 438/692 |
| 2006/0251800 | A1 | 11/2006 | Weidman et al. |
| 2008/0038995 | A1 | 2/2008 | Small et al. |
| 2008/0201943 | A1 | 8/2008 | Chinda et al. |
| 2008/0254628 | A1 | 10/2008 | Boggs et al. |
| 2009/0014415 | A1 * | 1/2009 | Chelle et al. .................. 216/53 |
| 2009/0318063 | A1 | 12/2009 | Misra |
| 2010/0087065 | A1 | 4/2010 | Boggs et al. |
| 2011/0177690 | A1 * | 7/2011 | Minami et al. ............... 438/693 |
| 2012/0024818 | A1 * | 2/2012 | Ono et al. ....................... 216/53 |
| 2012/0100718 | A1 | 4/2012 | Minami et al. |
| 2012/0160804 | A1 * | 6/2012 | Ono et al. ....................... 216/53 |
| 2012/0238094 | A1 * | 9/2012 | Minami et al. ............... 438/693 |

FOREIGN PATENT DOCUMENTS

| | | |
|---|---|---|
| JP | 2-278822 A | 11/1990 |
| JP | 11-121411 | 4/1999 |
| JP | 3192968 | 5/2001 |
| JP | 2005-076674 | 3/2005 |
| JP | 2005-117046 | 4/2005 |
| JP | 2005-117046 A | 4/2005 |
| JP | 3780767 | 3/2006 |
| JP | 2006-519490 A | 8/2006 |
| JP | 2006-295114 A | 10/2006 |
| JP | 2006-297501 | 11/2006 |
| JP | 2007-526626 | 9/2007 |
| JP | 2007-531274 A | 11/2007 |
| JP | 2008-034818 | 2/2008 |
| JP | 2008-034818 A | 2/2008 |
| JP | 2009-503910 | 1/2009 |
| WO | WO-00/39844 | 7/2000 |
| WO | WO-01/44396 A1 | 6/2001 |
| WO | WO-03/038883 A1 | 5/2003 |
| WO | 2005/100496 A2 | 10/2005 |
| WO | 2010/016390 A1 | 2/2010 |

OTHER PUBLICATIONS

F.B. Kaufman et al., "Chemical-Mechanical Polishing for Fabricating Patterned W Metal Features as Chip Interconnects", J. Electrochem. Soc., vol. 138, No. 11, Nov. 1991, pp. 3460-3464.

International Search Report for PCT/JP2010/051671 dated Apr. 27, 2010 (1 page).

Office Action from Republic of China, Taiwan Patent Office in the corresponding Patent Application No. 099103496 dated Feb. 21, 2014, 5 pages in Chinese.

Taiwanese Official Action dated Dec. 2, 2014, for corresponding TW Application No. 100100493.

International Preliminary Report on Patentability, issued from the International Bureau, in counterpart International Application No. PCT/JP2011/050012, dated Sep. 27, 2012, pp. 1-5.

International Search Report in corresponding International Application PCT/JP2011/050012, dated Feb. 8, 2011, pp. 1-2.

Communication dated Jul. 1, 2014, in connection witn Japanese Application No. 2013-172134; 3 Pages; Japanese Patent Office; Japan.

International Search Report for PCT/JP2009/063172, dated Oct. 27, 2009.

International Preliminary Report on Patentability, including the Written Opinion, issued by the International Bureau of WIPO on Mar. 8, 2011 for International Application No. PCT/JP2009/063172 (5 pages).

Office Action dated Feb. 22, 2012, in Chinese Application No. 200980130440.6.

* cited by examiner (a)

(b)

(a)

(b)

(a)

(b)

CMP FLUID AND METHOD FOR POLISHING PALLADIUM

TECHNICAL FIELD

The present invention relates to a CMP polishing liquid and method for polishing palladium.

BACKGROUND ART

New micromachining techniques are being developed in recent years for increasingly higher integration and higher performance of large-scale integrated circuits (LSIs). One such technique is Chemical Mechanical Polishing (CMP), the technique often used for flattening of interlayer insulating film layers, formation of metal plugs and formation of embedded wirings in LSI production steps, particularly in multilayer wiring forming steps (see Patent document 1, for example).

A metal polishing liquid used for CMP usually comprises an oxidizing agent and a solid abrasive, with further addition of a metal oxide solubilizer or protective film-forming agent (metal corrosion preventing agent) as necessary. The basic mechanism in polishing is considered to be, first, oxidation of the metal layer surface by the oxidizing agent to form an oxidation layer, and shaving of the oxidation layer by the solid abrasive.

The oxidation layer on the metal layer surface that has accumulated on trenches (concavities) is minimally contacted with the polishing cloth, and is therefore not reached by the shaving effect of the solid abrasive, whereas shaving proceeds at the oxidation layer on the metal layer surface accumulated on the convexities that contact the polishing cloth. As CMP proceeds, therefore, the metal layer on the convexities is removed and the substrate surface is flattened (see Non-patent document 1, for example).

For high integration of semiconductor elements, it is necessary to employ a multi-pin and narrow-pitch design, as well as thin mounting. Wiring delay and noise prevention between semiconductor elements and circuit boards have also become significant issues. Connecting systems for semiconductor elements and circuit boards therefore widely employ flip-chip mounting systems in place of conventional wire bonding-based mounting systems.

For flip-chip mounting systems, it is common to use solder bump connection methods in which bump electrodes are formed on the electrode terminals of a semiconductor element, and junction is accomplished en bloc through the bump electrodes onto connecting terminals formed on a circuit board.

It is known that CMP polishing liquids differ depending on the substance to be polished. For example, as polishing liquids for polishing of layers composed of titanium nitride or tantalum nitride formed on substrates, polishing liquids containing protective film-forming agents and organic acids are known (see Patent document 2, for example).

One known method that attempts to apply CMP to copper layers employs a CMP polishing liquid containing 2-quinolinecarboxylic acid (see Patent document 3, for example). Another known method that attempts to apply CMP to nickel layers employs a polishing liquid containing an abrasive, organic acid and oxidizing agent, as a CMP polishing liquid for HDD magnetic heads (see Patent document 4, for example).

Incidentally, palladium is generally classified as a "noble metal", together with platinum and ruthenium. Known methods that attempt to apply CMP to noble metal layers include a method employing a CMP polishing liquid containing a sulfur compound, a method employing a CMP polishing liquid containing a diketone, nitrogen-containing heterocyclic compound or amphoteric ion compound, and a method employing a CMP polishing liquid containing a platinum family metal oxide (see Patent documents 5, 6, 7, for example).

CITATION LIST

Patent Literature

[Patent document 1] U.S. Pat. No. 4,944,836
[Patent document 2] Japanese Patent Publication No. 3780767
[Patent document 3] Japanese Patent Publication No. 3192968
[Patent document 4] Japanese Unexamined Patent Application Publication No. 2006-297501
[Patent document 5] International Patent Publication No. WO01/44396
[Patent document 6] U.S. Pat. No. 6,527,622
[Patent document 7] Japanese Unexamined Patent Application Publication HEI No. 11-121411

Non Patent Literature

[Non-patent document 1] Journal of Electrochemical Society, Vol. 138, No. 11 (1991), p. 3460-3464

SUMMARY OF INVENTION

Technical Problem

In the flip-chip mounting systems mentioned above, methods of providing a palladium or palladium alloy layer at the bump electrode sections have recently been studied. In mounting systems using wire bonding, efforts are being made to employ copper wires instead of the conventionally used gold wires, with the aim of achieving cost reduction. The use of palladium or palladium alloy in bonding pads is also being investigated for improved reliability.

However, such systems have not reached large-scale implementation because polishing of palladium by CMP has not been sufficiently studied to date. Findings by the present inventors have indicated that it is very difficult to polish palladium, which is poorly oxidized and extremely hard, using the polishing liquids of Patent documents 2, 3 and 4. It has also found that, while platinum and ruthenium can be polished with the polishing liquids of Patent documents 5, 6 and 7 which are designed for polishing of noble metals, polishing proceeds with extreme difficulty when palladium is polished using the same polishing liquids.

In addition, recent investigation by the present inventors has shown that polishing rates have gradually reduced when a plurality of palladium layers are continuously polished even if polishing liquids that allow polishing of palladium are used.

It is therefore an object of the present invention to provide a CMP polishing liquid for polishing palladium which, compared to the case using a conventional polishing liquid, allows to increase the polishing rate for a palladium layer and allows polishing at a stable polishing rate even when a plurality of palladium layers are continuously polished, as well as a polishing method that employs the CMP polishing liquid."

Solution to Problem

The invention provides a CMP polishing liquid for polishing palladium comprising an organic solvent, 1,2,4-triazole, a phosphorus acid compound, an oxidizing agent and an abrasive.

The CMP polishing liquid for polishing palladium having such a composition, compared to the case using a conventional CMP polishing liquid, allows to increase the polishing rate for a palladium layer and allows polishing with the desired polishing rate. Using a CMP polishing liquid comprising 1,2,4-triazole, a phosphorus acid compound and an oxidizing agent facilitates polishing of palladium layer.

Polishing of palladium layer is inhibited by adhesion of palladium-containing compounds onto the polishing cloth as polishing proceeds. The adhered substances cannot be removed by dressing of the polishing cloth or cleaning with acids or alkalis, and as a result, the polishing rate for palladium layer is reduced and stable polishing can not be accomplished.

However, the CMP polishing liquid for polishing palladium having the composition described above allows polishing at a more stable polishing rate than when using a conventional CMP polishing liquid, by dissolving the palladium-containing compounds in the organic solvent and preventing their adhesion onto the polishing cloth during continuous polishing of a plurality of palladium layers.

This effect is markedly superior to the effects obtained by using the CMP polishing liquids specifically disclosed in International Patent Publication No. WO2003/038883, International Patent Publication No. WO2000/039844 and elsewhere.

The CMP polishing liquid for polishing palladium according to the invention preferably comprises at least one kind selected from among a glycol, a glycol derivative, an alcohol, a carbonic acid ester and a carboxylic acid ester, as the organic solvent. Such a composition will allow more efficient dissolution of the palladium-containing compounds produced during polishing, and will allow polishing of palladium layer at a more stable polishing rate.

Incidentally, if the organic solvent in the CMP polishing liquid has reducing character, the palladium ion produced by dissolution of the palladium-containing compounds will sometimes be reduced to palladium metal by the organic solvent. When the palladium metal generated in this manner adheres to the polishing cloth, the polishing rate can gradually fall during continuous polishing of a plurality of palladium layers. In this regard, the present inventors have found that this fall in polishing rate can be prevented by adding an amino acid or an organic acid with no primary hydroxyl groups to the CMP polishing liquid. That is, the CMP polishing liquid for polishing palladium of the invention may comprise a reducing organic solvent as the organic solvent, and may further comprise at least one kind selected from among an amino acid and an organic acid with no primary hydroxyl groups. Such a composition will allow polishing of palladium layer to be accomplished at a more stable polishing rate than with conventional CMP polishing liquids, even when an organic solvent with reducing character is used.

While the reason that the fall in polishing rate is prevented is not completely understood, the present inventors conjecture as follows. Specifically, the amino acid and/or organic acid with no primary hydroxyl groups coordinates with the palladium ion generated by dissolution of the palladium-containing compounds in the organic solvent. This can prevent reduction of the palladium ion to palladium metal by the reducing organic solvent, and can prevent adhesion of palladium metal onto the polishing cloth. It is thereby possible to accomplish polishing of palladium layer at a more stable polishing rate than with conventional CMP polishing liquids, even when a reducing organic solvent is used.

The CMP polishing liquid for polishing palladium of the invention preferably comprises a carboxylic acid as the organic acid. Such a composition will allow more efficient dissolution of the palladium-containing compounds produced during polishing and will allow polishing of palladium layer at a more stable polishing rate, compared to using a conventional CMP polishing liquid, even when a reducing organic solvent is used.

The CMP polishing liquid for polishing palladium of the invention preferably comprises at least one kind selected from among glycine, alanine, arginine, isoleucine, leucine, valine, phenylalanine, asparagine, glutamine, lysine, histidine, proline, tryptophan, aspartic acid, glutamic acid, serine, threonine, tyrosine, cysteine, methionine, and derivatives of the foregoing, as the amino acid. Such a composition will allow polishing of palladium layer to be accomplished at a more stable polishing rate than with conventional CMP polishing liquids, even when a reducing organic solvent is used.

The CMP polishing liquid for polishing palladium of the invention preferably comprises an organic solvent with at least one kind selected from among primary hydroxyl groups and secondary hydroxyl groups, as the reducing organic solvent, and more preferably it comprises at least one kind selected from among a glycol, a glycol derivative and an alcohol as the organic solvent. Such a composition will allow polishing of palladium layer to be accomplished at a more stable polishing rate than with conventional CMP polishing liquids, even when a reducing organic solvent is used.

The CMP polishing liquid for polishing palladium of the invention preferably comprises at least one kind selected from among hydrogen peroxide, periodic acid, a periodic acid salt, an iodic acid salt, a bromic acid salt and a persulfuric acid salt as the oxidizing agent. The CMP polishing liquid for polishing palladium of the invention preferably comprises an abrasive composed of at least one kind selected from among alumina, silica, zirconia, titania and ceria, as the abrasive.

The CMP polishing liquid for polishing palladium of the invention may be stored with constituent components of the polishing liquid separated into at least a first liquid and a second liquid, so that the CMP polishing liquid for polishing palladium is formed, the first liquid comprising at least the organic solvent, and the second liquid comprising at least one kind selected from among the amino acid and the organic acid with no primary hydroxyl groups.

The invention also provides a polishing method for a substrate whereby a substrate is polished with a polishing cloth while supplying a CMP polishing liquid between the substrate and the polishing cloth, wherein the substrate is a substrate with a palladium layer on the side facing the polishing cloth, and the CMP polishing liquid is a CMP polishing liquid comprising an organic solvent, 1,2,4-triazole, a phosphorus acid compound, an oxidizing agent and an abrasive.

The polishing method having such a composition employs the CMP polishing liquid having the same composition described above, therefore, compared to the case using a conventional polishing liquid, it is possible to increase the polishing rate for palladium layer and accomplish polishing at a stable polishing rate even when a plurality of palladium layers are continuously polished.

Advantageous Effects of Invention

According to the invention, it is possible to increase the polishing rate for palladium layer compared to the case using a conventional CMP polishing liquid, and to accomplish polishing with the desired polishing rate. Also according to the invention, when continuously polishing a plurality of palladium layers, it is possible to accomplish polishing at a more stable polishing rate than when using a conventional CMP polishing liquid.

DESCRIPTION OF EMBODIMENTS

Figure 1:
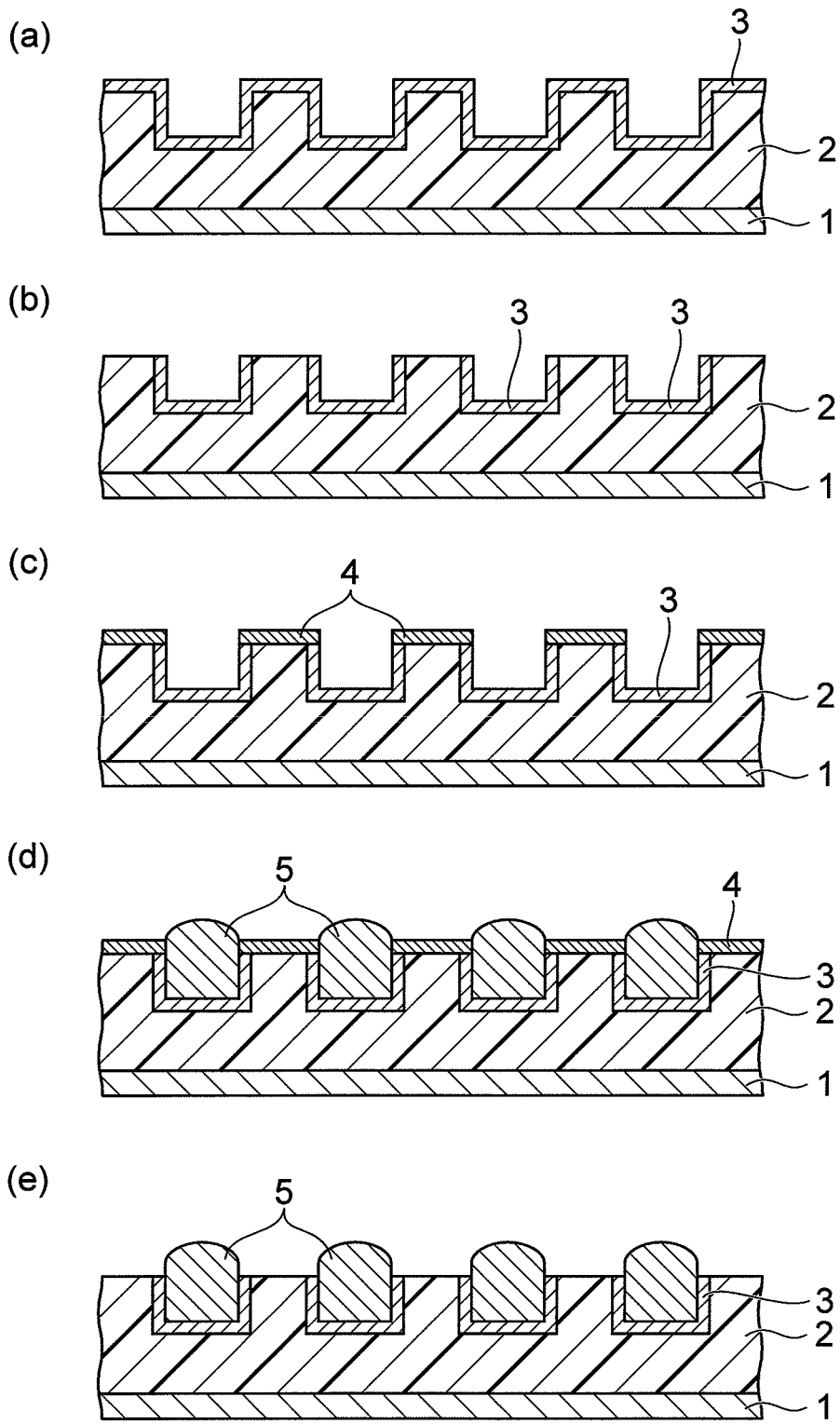
FIG. 1 is a cross-sectional view showing a first embodiment of a method for producing a substrate with bump electrodes.

Embodiments for carrying out the present invention will now be explained in further detail.

First Embodiment

The CMP polishing liquid according to the first embodiment comprises an organic solvent, 1,2,4-triazole, a phosphorus acid compound, an oxidizing agent and an abrasive.
(Organic Solvent)

The CMP polishing liquid comprises an organic solvent. It is presumed that the organic solvent dissolves poorly water-soluble palladium-containing compounds that are generated during polishing and inhibits adhesion of such compounds to the polishing cloth, and thereby inhibits reduction in polishing rate for palladium layer.

The organic solvent is preferably one that can be optionally mixed with water. Examples of organic solvents include carbonic acid esters, lactones, glycols, glycol derivatives, ethers, alcohols, ketones, carboxylic acid esters and the like.

Examples of carbonic acid esters include ethylene carbonate, propylene carbonate, dimethyl carbonate, diethyl carbonate and methylethyl carbonate.

Examples of lactones include butyrolactone and propiolactone.

Examples of glycols include ethylene glycol, propylene glycol, diethylene glycol, dipropylene glycol, triethylene glycol and tripropylene glycol.

Examples of glycol derivatives include glycol monoethers such as ethyleneglycol monomethyl ether, propyleneglycol monomethyl ether, diethyleneglycol monomethyl ether, dipropyleneglycol monomethyl ether, triethyleneglycol monomethyl ether, tripropyleneglycol monomethyl ether, ethyleneglycol monoethyl ether, propyleneglycol monoethyl ether, diethyleneglycol monoethyl ether, dipropyleneglycol monoethyl ether, triethyleneglycol monoethyl ether, tripropyleneglycol monoethyl ether, ethyleneglycol monopropyl ether, propyleneglycol monopropyl ether, diethyleneglycol monopropyl ether, dipropyleneglycol monopropyl ether, triethyleneglycol monopropyl ether, tripropyleneglycol monopropyl ether, ethyleneglycol monobutyl ether, propyleneglycol monobutyl ether, diethyleneglycol monobutyl ether, dipropyleneglycol monobutyl ether, triethyleneglycol monobutyl ether, tripropyleneglycol monobutyl ether, ethyleneglycol monoisobutyl ether, ethyleneglycol monophenyl ether, propyleneglycol monophenyl ether and polyethyleneglycol monomethyl ether; and glycol diethers such as ethyleneglycol dimethyl ether, propyleneglycol dimethyl ether, diethyleneglycol dimethyl ether, dipropyleneglycol dimethyl ether, triethyleneglycol dimethyl ether, tripropyleneglycol dimethyl ether, ethyleneglycol diethyl ether, propyleneglycol diethyl ether, diethyleneglycol diethyl ether, dipropyleneglycol diethyl ether, triethyleneglycol diethyl ether, tripropyleneglycol diethyl ether, ethyleneglycol dipropyl ether, propyleneglycol dipropyl ether, diethyleneglycol dipropyl ether, dipropyleneglycol dipropyl ether, triethyleneglycol dipropyl ether, tripropyleneglycol dipropyl ether, ethyleneglycol dibutyl ether, propyleneglycol dibutyl ether, diethyleneglycol dibutyl ether, dipropyleneglycol dibutyl ether, triethyleneglycol dibutyl ether, tripropyleneglycol dibutyl ether, diethyleneglycol ethyl methyl ether, diethyleneglycol butyl methyl ether, triethyleneglycol butyl methyl ether and polyethyleneglycol dimethyl ether.

Examples of ethers include tetrahydrofuran, dioxane, dimethoxyethane, polyethylene oxide, ethyleneglycol monomethyl acetate, diethyleneglycol monoethyl ether acetate and propyleneglycol monomethyl ether acetate.

Examples of alcohols include methanol, ethanol, 1-propanol, isopropyl alcohol, 1-butanol, 2-butanol, isobutanol, 2-methyl-2-propanol, 1-pentanol and 1-hexanol.

Examples of ketones include acetone and methyl ethyl ketone.

Examples of carboxylic acid esters include ethyl acetate and ethyl lactate.

Also, examples of organic solvents include glycerin, phenols, dimethylformamide, n-methylpyrrolidone, sulfolane and cyclohexane.

A single organic solvent may be used alone, or two or more may be used in admixture.

When the organic solvent is used without being in combination with at least one kind selected from among amino acids and organic acids with no primary hydroxyl groups, the organic solvent is preferably one with low reducing character from the viewpoint of more effectively preventing reduction in the polishing rate for palladium layer with multiple polishings. Specifically, it is preferably one that does not reduce palladium ion to palladium metal, and it is preferable to use the organic solvent that does not produce a reduced solid from palladium ion when the organic solvent and the palladium ion-containing substance are mixed. Such a property can be determined, for example, by examining whether or not palladium acetate dissolves when 5 mg of palladium acetate has been added to and stirred with 5 g of organic solvent. If the organic solvent has high reducing character, the palladium acetate that has dissolved will subsequently be reduced, tending to cause precipitation of solid palladium.

The organic solvent is preferably a solvent that has a solid palladium precipitation amount of not greater than 0.1 mg after 5 mg of palladium acetate has been added to and stirred with 5 g of organic solvent to complete dissolution of the palladium acetate, and then allowed to stand for 1 day. Such an organic solvent will tend to more effectively inhibit reduction in polishing rate for palladium layer.

From the viewpoint of tending to more efficiently dissolve poorly water-soluble palladium-containing compounds and thereby absolutely minimize reduction in polishing rate for palladium layer after continuous polishing of palladium layers, there are preferred carbonic acid esters, glycols, glycol derivatives, alcohols and carboxylic acid esters, with glycols, glycol derivatives, alcohols and carboxylic acid esters being more preferred.

The organic solvent content is preferably 0.1-95 mass % based on the total mass of the CMP polishing liquid. The content of 0.1 mass % or greater will tend to further prevent gradual reduction in polishing rate for palladium layers after continuous polishing of palladium layers. From this standpoint, the lower limit for the content is more preferably 0.2 mass %, and even more preferably 0.5 mass %. Also, if the content is not greater than 95 mass %, the solubility of the CMP polishing liquid components will tend to be improved and aggregation of the abrasive will tend to be inhibited. From this standpoint, the upper limit for the content is more preferably 50 mass %, and even more preferably 30 mass %.

1,2,4-Triazole

The CMP polishing liquid comprises 1,2,4-triazole as a complexing agent. A complexing agent is a substance that can form a complex by coordinating with a metal, and for 1,2,4-triazole as well, it is believed to form a complex with palladium, similarly to the phosphorus acid compound described below, and presumably the formed complex is easily polished and thereby results in a satisfactory polishing rate. Although it can be imagined that nitrogen-containing compounds can form complexes with palladium, but based on research by the present inventors, the polishing rate for palladium layer cannot be increased with compounds other than 1,2,4-triazole. For example, a satisfactory polishing rate for palladium layer is difficult to achieve, when 1,2,3-triazole having similar structure to 1,2,4-triazole, and 3-amino-1,2,4-triazole are used instead of 1,2,4-triazole.

The 1,2,4-triazole content is preferably 0.001-20 mass % based on the total mass of the CMP polishing liquid. If the content is at least 0.001 mass %, the polishing rate for palladium layer by CMP will tend to be further increased. From this standpoint, the lower limit for the content is more preferably 0.01 mass %, and even more preferably 0.05 mass %. The content of not greater than 20 mass % will tend to allow saturation of the polishing rate for palladium layer to be prevented. From this standpoint, the upper limit for the content is more preferably 15 mass %, even more preferably 12 mass % and especially preferably 10 mass %.

(Phosphorus Acid Compound)

The CMP polishing liquid comprises a phosphorus acid compound. Phosphorus acid compounds can promote polishing of metal films by complexing with and/or dissolving metals that have been oxidized by an oxidizing agent described below, and they are presumed to function as metal oxide solubilizers for palladium.

Although it can be imagined that compounds that function as metal oxide solubilizers for palladium include various inorganic acids and organic acids, but based on research by the present inventors, it is difficult to obtain a satisfactory polishing rate for palladium with acids other than phosphorus acid compounds.

Phosphorus acid compounds are phosphoric acid, phosphorous acid and hypophosphorous acid, as well as their condensates. (including salts) Examples of phosphorus acid compounds include phosphoric acid, phosphorous acid, hypophosphorous acid, pyrophosphoric acid, pyrophosphorous acid, trimetaphosphoric acid, tetrametaphosphoric acid, hexametaphosphoric acid, polyphosphoric acid and tripolyphosphoric acid, as well as condensed phosphorus acids, and their salts. These phosphorus acid compounds may be used alone or in combinations of two or more.

A phosphoric acid salt is a salt of a phosphorus acid anion and a cation. Examples of phosphoric acid anions include phosphate ion, phosphite ion, hypophosphite ion, pyrophosphate ion, pyrophosphite ion, trimetaphosphate ion, tetrametaphosphate ion, hexametaphosphate ion, polyphosphate ion, tripolyphosphate ion, and condensed phosphate ions. Examples of cations include lithium, sodium, potassium, rubidium, cesium, beryllium, magnesium, calcium, strontium, barium, titanium, zirconium, vanadium, chromium, manganese, iron, cobalt, nickel, copper, silver, palladium, zinc, aluminum, gallium, tin and ammonium ions. These salts may be primary salts having one metal and 2 hydrogens in the molecule, secondary salts having 2 metals and one hydrogen, or tertiary salts having 3 metals, and they may be acidic salts, alkaline salts or neutral salts.

The phosphorus acid compound content is preferably 0.001-20 mass % based on the total mass of the CMP polishing liquid. If the content is at least 0.001 mass %, the polishing rate for palladium layer by CMP will tend to be further increased, and when polishing of a nickel layer or an underlying metal layer is also necessary as described below, their polishing rates will also tend to be increased. From this standpoint, the lower limit for the content is more preferably 0.01 mass %, and even more preferably 0.02 mass %. The content of not greater than 20 mass % will tend to allow saturation of the polishing rate for palladium layer to be prevented. From this standpoint, the upper limit for the content is more preferably 15 mass %, and even more preferably 10 mass %.

(Oxidizing Agent)

The CMP polishing liquid comprises an oxidizing agent. The oxidizing agent in the CMP polishing liquid may be an oxidizing agent for a metal used in a substrate, for layer formation or the like. Oxidizing agents include hydrogen peroxide ($H_2O_2$), periodic acid, periodic acid salts, iodic acid salts, bromic acid salts, persulfuric acid salts and the like, with hydrogen peroxide being especially preferred. These oxidizing agents may be used alone or in mixtures of two or more.

The oxidizing agent content is preferably 0.05-20 mass % based on the total mass of the CMP polishing liquid. If the content is at least 0.05 mass %, the metal oxidation will tend to be sufficient and the polishing rate for palladium layers will tend to be further increased, and when polishing of a nickel layer or an underlying metal layer is also necessary as described below, their polishing rates will also tend to be increased. From this standpoint, the content is more preferably 0.1 mass % or greater. The content of not greater than 20 mass % will tend to prevent roughening of the polished surface. From this standpoint, the content is more preferably not greater than 15 mass % and even more preferably not greater than 10 mass %.

(Abrasive)

The CMP polishing liquid comprises an abrasive. The abrasive may be, specifically, alumina (fumed alumina, transitional alumina), silica (fumed silica, colloidal silica), zirconia, titania, ceria and the like, among which fumed alumina, transitional alumina, fumed silica and colloidal silica are preferred, and colloidal silica is more preferred from the standpoint of inhibiting polishing scratch while maintaining a high polishing rate.

The abrasive content is preferably 0.1-10 mass % based on the total mass of the CMP polishing liquid. If the content is 0.1 mass % or greater, it will be possible to obtain a sufficient effect of physical shaving, and the polishing rate by CMP will tend to be further increased. From this standpoint, the content is more preferably 0.2 mass % or greater. Also, if the content is not greater than 10 mass %, aggregation and sedimentation of the particles will tend to be prevented, and an increase in the polishing rate commensurate with the content will tend to be obtained. From this standpoint, the content is more preferably not greater than 8 mass %. This tendency is seen more notably on the polishing rate for palladium layer.

The mean primary particle size of the abrasive is preferably not greater than 300 nm, more preferably not greater than 200 nm, even more preferably not greater than 150 nm and extremely preferably not greater than 100 nm, from the viewpoint of improving the flatness and preventing scratches from remaining on the polished surface after polishing. There are no particular restrictions on the lower limit of the mean primary particle size, but from the viewpoint of allowing a satisfactory physical shaving effect to be obtained, it is preferably 1 nm, more preferably 3 nm and even more preferably 5 nm.

The "mean primary particle size" is the mean diameter of particles that can be calculated from the BET specific surface area, and it is calculated by the following formula (1) based on measurement of the specific surface area of adsorption (hereunder referred to as "BET specific surface area") by a gas adsorption method.

$$D1 = 6/(\rho \times V) \quad (1)$$

In formula (1), D1 represents the primary particle size (unit: m), $\rho$ represents the particle density (unit: kg/m$^3$) and V represents the BET specific surface area (unit: m$^2$/g).

More specifically, first the abrasive is dried with a vacuum freeze drier, and the residue is finely crushed with a mortar (magnetic, 100 ml) to prepare a measuring sample, and its BET specific surface area V is measured using a BET specific surface area measuring apparatus (product name: AUTOSORB 6) by Yuasa-Ionics, Inc., then the primary particle size D1 is calculated. When the particles are colloidal silica, the density $\rho$ of the particles is "$\rho$=2200 (kg/m$^3$)".

By inserting the BET specific surface area V (m$^2$/g) into formula (2) below, therefore, it is possible to calculate the primary particle size D1.

$$D1 = 2.727 \times 10^{-6}/V \quad (m) \quad (2)$$
$$= 2727/V \quad (nm)$$

The mean secondary particle size of the abrasive grain is preferably 5-500 nm. From the standpoint of improving the flatness, the upper limit of the mean secondary particle size is more preferably 300 nm, even more preferably 200 nm and extremely preferably 100 nm. Also, from the standpoint of allowing sufficient mechanical reaction layer (oxidation layer)-removing power by the abrasive, and further increasing the polishing rate, the lower limit of the mean secondary particle size is more preferably 7 nm and even more preferably 10 nm.

The mean secondary particle size of the abrasive is the mean secondary particle size of the abrasive in the CMP polishing liquid, and it can be measured, for example, using an optical diffraction scattering particle size distribution meter (for example, COULTER N4SD by Coulter Electronics).

(Metal Corrosion Preventing Agent)

The CMP polishing liquid may comprise a metal corrosion preventing agent. The metal corrosion preventing agent is a compound that inhibits etching of the metal layer and improves the anti-dishing property.

Specific examples of metal corrosion preventing agents include imines, azoles and mercaptanes other than 1,2,4-triazole. Among these, from the viewpoint of minimizing the etching rate for the metal layer while also further increasing the polishing rate for metal layer, a nitrogen-containing cyclic compound is preferred. Such compounds may be used alone or in combinations of two or more types.

Specific imines include dithizone, cuproine (2,2'-biquinoline), neocuproine (2,9-dimethyl-1,10-phenanthroline), bathocuproin (2,9-dimethyl-4,7-diphenyl-1,10-phenanthroline) and cuperazone (biscyclohexanoneoxalylhydrazone).

Specific azoles include benzimidazole-2-thiol, triazinedithiol, triazinetrithiol, 2-[2-(benzothiazolyl)]thiopropionic acid, 2-[2-(benzothiazolyl)]thiobutyric acid, 2-mercaptobenzothiazole, 1,2,3-triazole, 2-amino-1H-1,2,4-triazole, 3-amino-1H-1,2,4-triazole, 3,5-diamino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-carboxyl-1H-benzotriazolemethyl ester, 4-carboxyl-1H-benzotriazole butyl ester, 4-carboxyl-1H-benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl]phosphonic acid, tetrazole, 5-amino-tetrazole, 5-methyl-tetrazole, 1-methyl-5-mercaptotetrazole and 1-N,N-dimethylaminoethyl-5-tetrazole.

Specific mercaptanes include nonylmercaptane and dodecylmercaptane.

When a metal corrosion preventing agent is included, the metal corrosion preventing agent content is preferably in a range that does not impair the effect of increasing the polishing rate by the 1,2,4-triazole and phosphorus acid compound, and it is preferably 0.005-2.0 mass % based on the total mass of the CMP polishing liquid, from the viewpoint of achieving both an etching prevention function and the desired polishing rate. From the viewpoint of obtaining even higher etching performance, the content is more preferably 0.01 mass % or greater and even more preferably 0.02 mass % or greater. From the viewpoint of more easily obtaining a favorable polishing rate, the content is more preferably not greater than 1.0 mass % and even more preferably not greater than 0.5 mass %.

(Water-Soluble Polymer)

The CMP polishing liquid may comprise a water-soluble polymer, from the viewpoint of improving the flatness after polishing. From this standpoint, the weight-average molecular weight of the water-soluble polymer is preferably 500 or greater, more preferably 1500 or greater and even more preferably 5000 or greater. The upper limit of the weight-average molecular weight is not necessarily specified but is preferably 5 million, from the viewpoint of solubility. If the weight-average molecular weight is 500 or greater, the polishing rate will tend to be further increased.

The weight-average molecular weight may be measured by gel permeation chromatography (GPC), using a standard polystyrene calibration curve. More specifically, the weight-average molecular weight may be measured under the following conditions.

Device: Hitachi Model L-6000 [product of Hitachi, Ltd.]
Column: GL-R420 Gel pack+GL-R430 Gel pack+GL-R440 Gel pack (total of 3, by Hitachi Chemical Co., Ltd.)
Eluent: tetrahydrofuran
Measuring temperature: 40° C.
Flow rate: 1.75 ml/min.
Detector: L-3300RI [Hitachi, Ltd.]

The water-soluble polymer with a weight-average molecular weight of 500 or greater is not particularly restricted so long as there is no reduction in solubility of the components in the CMP polishing liquid and there is no aggregation of the abrasive, and specific ones include polysaccharides, polycarboxylic acid compounds, vinyl polymers and glycol polymers. They may be used alone or in mixtures of two or more. The water-soluble polymer may be a homopolymer consisting of a single monomer, or a copolymer comprising two or more monomers.

Examples of polysaccharides include alginic acid, pectinic acid, carboxymethyl cellulose, agar, curdlan and pullulan.

The polycarboxylic acid compound may be a polymer or copolymer comprising a carboxylic acid or carboxylic acid ester as a monomer unit. Examples of such carboxylic acids include aspartic acid, glutamic acid, lysine, malic acid, methacrylic acid, amic acid, maleic acid, itaconic acid, fumaric acid, p-styrenecarboxylic acid, acrylic acid, acrylamide, aminoacrylamide, ammonium acrylate salt, sodium acrylate salt, amic acid, amic acid ammonium salt, amic acid sodium salt and glyoxylic acid. The carboxylic acid ester may be a lower alkyl (C1-C5) ester of any of the aforementioned carboxylic acids.

The polycarboxylic acid compound may be in the form of a salt, and specific examples include ammonium salts, sodium salts and potassium salts, with ammonium salts being preferred.

Specific examples of vinyl polymers to be used as the water-soluble polymer include polyvinyl alcohol, polyvinylpyrrolidone and polyacrolein. Polyethylene glycol or the like may also be used.

When a water-soluble polymer is included, the water-soluble polymer content is preferably not greater than 5 mass % and more preferably not greater than 2 mass %, based on the total mass of the CMP polishing liquid. If the content is not greater than 5 mass %, it will be possible to sufficiently inhibit aggregation of the abrasive.

(Water)

The CMP polishing liquid comprises water. There are no particular restrictions on the water, but deionized water or ultrapure water is preferred. The water content is not particularly restricted and may be the content of the remainder excluding the other components.

(CMP Polishing Liquid Preparation Method)

The CMP polishing liquid may be obtained by mixing the aforementioned components. The proportion of the components composing the CMP polishing liquid is preferably adjusted so that each of the components has the preferred content specified above. If the proportions of the components composing the CMP polishing liquid for polishing palladium are in the ranges specified above, it will be possible to further increase the polishing rate for palladium layer, and to accomplish polishing at a more stable polishing rate even with continuous polishing of a plurality of palladium layers.

(pH)

The pH of the CMP polishing liquid is preferably 1-12, from the viewpoint of further increasing the CMP polishing rate for palladium layer. If the pH is 1-6, it will be easier to sufficiently ensure the prescribed polishing rate by CMP so that the CMP polishing liquid will be more practical. The pH is more preferably 1-5 and even more preferably 1-4.

The pH of the CMP polishing liquid can be measured using a pH meter (for example, a Model PHL-40 by DKK Corp.). The measured pH value used is obtained by using standard buffer (phthalate pH buffer: pH 4.01 (25° C.), neutral phosphate pH buffer: pH 6.86 (25° C.)), placing an electrode in the CMP polishing liquid after 2-point calibration and then measuring the value upon stabilization after an elapse of 2 minutes or more.

Second Embodiment

The CMP polishing liquid of the second embodiment comprises at least an organic solvent, an organic acid with no primary hydroxyl groups, 1,2,4-triazole, a phosphorus acid compound, an oxidizing agent and an abrasive. The CMP polishing liquid of the second embodiment will be explained only in terms of its differences from the CMP polishing liquid of the first embodiment, without explaining their similarities.

Since an organic solvent and an organic acid with no primary hydroxyl groups are used in combination in the CMP polishing liquid of the second embodiment, the organic acid coordinates with the palladium ion that is produced by dissolving the poorly water-soluble palladium-containing compound in the organic solvent. This can prevent the reduction of the palladium ion to palladium metal, and can prevent adhesion of the palladium metal onto the polishing cloth. It is thus possible to further inhibit reduction in the polishing rate and accomplish polishing at a stable polishing rate, compared to a conventional CMP polishing liquid, even when an organic solvent with reducing character is used as the organic solvent.

(Organic Solvent)

The organic solvent may be an organic solvent with reducing character or an organic solvent without reducing character, and the organic solvent used may be the same as for the CMP polishing liquid of the first embodiment. The phrase "organic solvent with reducing character" means an organic solvent wherein palladium ion is reduced to palladium metal when the organic solvent and the palladium ion-containing substance are mixed. Specifically, it is an organic solvent that has a solid palladium precipitation amount exceeding 0.1 mg after 5 mg of palladium acetate has been added to and stirred with 5 g of organic solvent and allowed to stand for 1 day.

The organic solvent with reducing character is preferably an organic solvent having at least one kind selected from among primary hydroxyl and secondary hydroxyl groups, and among the organic solvent, preferred organic solvents are at least one kind selected from among glycols, glycol derivatives and alcohols, from the viewpoint of tending to more efficiently dissolve poorly water-soluble palladium-containing compounds and thereby absolutely minimize reduction in polishing rate for palladium layer when palladium layers have been continuously polished.

Examples of organic solvents with reducing character include glycols such as ethylene glycol, propylene glycol, diethylene glycol, dipropylene glycol and triethylene glycol; glycol derivatives such as ethyleneglycol monomethyl ether, ethyleneglycol monoethyl ether, ethyleneglycol monobutyl ether, ethyleneglycol monopropyl ether, ethyleneglycol monoisobutyl ether, ethyleneglycol monophenyl ether, diethyleneglycol monomethyl ether, diethyleneglycol monopropyl ether, diethyleneglycol monobutyl ether, diethyleneglycol dimethyl ether, diethyleneglycol diethyl ether, diethyleneglycol dibutyl ether, diethyleneglycol ethyl methyl ether, diethyleneglycol butyl methyl ether, triethyleneglycol monomethyl ether, triethyleneglycol monobutyl ether, triethyleneglycol dimethyl ether, triethyleneglycol butyl methyl ether, polyethyleneglycol monomethyl ether, polyethyleneglycol dimethyl ether, propyleneglycol monomethyl ether, propyleneglycol dimethyl ether, propyleneglycol monopropyl ether, propyleneglycol monobutyl ether, propyleneglycol phenyl ether, dipropyleneglycol monomethyl ether, dipropyleneglycol dimethyl ether, dipropyleneglycol monobutyl ether and tripropyleneglycol dimethyl ether; alcohols such as methanol, ethanol, 1-propanol, isopropyl alcohol, 1-butanol, 2-butanol, isobutanol and 2-methyl-2-propanol; and glycerins.

(Organic Acid)

Examples of organic acids with no primary hydroxyl groups include at least one kind selected from among organic acids with no hydroxyl groups, organic acids with only secondary hydroxyl groups, organic acids with only tertiary hydroxyl groups and organic acids with only secondary and tertiary hydroxyl groups. Organic acids with no primary hydroxyl groups are preferably carboxylic acids, examples of which include formic acid, acetic acid, glyoxylic acid, pyruvic acid, lactic acid, mandelic acid, vinylacetic acid, 3-hydroxybutyric acid, oxalic acid, maleic acid, malonic acid, methylmalonic acid, dimethylmalonic acid, phthalic acid, tartaric acid, fumaric acid, malic acid, succinic acid, glutaric acid and citric acid. Preferred among these are organic acids that can dissolve in water. These organic acids may be used alone, or two or more thereof may be used in combination.

When the organic acid and the organic solvent are used in combination, the preferred combinations are lactic acid and ethanol; lactic acid and isopropyl alcohol; mandelic acid and ethanol; maleic acid and ethanol; tartaric acid and ethanol; malic acid and ethanol; malic acid and ethyleneglycol monomethyl ether; citric acid and methanol; citric acid and ethanol; lactic acid, ethanol and methanol; lactic acid, ethanol, methanol and isopropyl alcohol; and lactic acid, ethanol, isopropyl alcohol and 1-propanol.

The property of the organic acid of inhibiting reduction of palladium ion to palladium metal can be determined by, for example, adding 5 mg of palladium acetate to 2.5 g of the organic solvent, 0.5 g of the organic acid and 2 g of water, stirring the mixture and allowing it to stand for 1 day, and then examining whether or not a black or white silver solid is produced. If the organic acid can prevent reduction of palladium ion, the precipitation amount of black or white silver palladium solid will be limited to not greater than 0.1 mg.

When the solubility of the organic acid in water is lower than 250 g/1 L, the property can be determined by, for example, adding 5 mg of palladium acetate to 2.5 g of the organic solvent, 0.1 g of the organic acid and 2 g of water, stirring the mixture and allowing it to stand for 1 day, and then examining whether or not a black or white silver solid is produced. If the organic acid can prevent reduction of palladium ion, the precipitation amount of black or white silver palladium solid will be limited to not greater than 0.1 mg.

The organic acid content is preferably 0.01-20 mass % based on the total mass of the CMP polishing liquid. If the content is 0.01 mass % or greater, reduction of palladium ion by the organic solvent with reducing character will tend to be further inhibited. From this standpoint, the content is more preferably 0.05 mass % or greater and even more preferably 0.1 mass % or greater. The content of not greater than 20 mass % will tend to further inhibit reduction in the palladium polishing rate. From this standpoint, the content is more preferably not greater than 15 mass % and even more preferably not greater than 10 mass %.

Third Embodiment

The CMP polishing liquid of the third embodiment comprises at least an organic solvent, an amino acid, 1,2,4-triazole, a phosphorus acid compound, an oxidizing agent and an abrasive. The CMP polishing liquid of the third embodiment will be explained only in terms of its differences from the CMP polishing liquids of the first and second embodiments, without explaining their similarities.

Since an organic solvent and an amino acid are used in combination in the CMP polishing liquid of the third embodiment, the amino acid coordinates with the palladium ion that is produced by dissolving the poorly water-soluble palladium-containing compound in the organic solvent. This can prevent the reduction of the palladium ion to palladium metal, and can prevent adhesion of the palladium metal onto the polishing cloth. It is thus possible to further inhibit reduction in the polishing rate and accomplish polishing at a stable polishing rate, compared to a conventional CMP polishing liquid, even when an organic solvent with reducing character is used as the organic solvent.

(Organic Solvent)

The organic solvent may be an organic solvent with reducing character or an organic solvent without reducing character, and the organic solvent used may be the same as for the CMP polishing liquid of the first embodiment.

The organic solvent with reducing character is preferably an organic solvent having at least one kind selected from among primary hydroxyl and secondary hydroxyl groups, and among the organic solvent, preferred organic solvents are at least one kind selected from among glycols, glycol derivatives and alcohols, from the viewpoint of tending to more efficiently dissolve poorly water-soluble palladium-containing compounds and thereby absolutely minimize reduction in polishing rate for palladium layer when palladium layers have been continuously polished. Specific examples for the organic solvent with reducing character include the same organic solvents for the CMP polishing liquid of the second embodiment.

(Amino Acid)

There are no particular restrictions on the amino acid, preferred examples of which include glycine, alanine, arginine, isoleucine, leucine, valine, phenylalanine, asparagine, glutamine, lysine, histidine, proline, tryptophan, aspartic acid, glutamic acid, serine, threonine, tyrosine, cysteine, methionine, and their derivatives, and more preferred are at least one kind selected from among glycine, alanine, arginine, histidine and serine. The derivatives include glycylglycine, sarcosine and methylalanine. Preferred among these are amino acids that can dissolve in water. These amino acids may be used alone or in combinations of two or more.

When the amino acid and organic solvent are used in combination, the preferred combinations are glycine and ethanol; alanine and ethanol; arginine and ethanol; histidine and ethanol; serine and ethanol; glycine, ethanol and methanol; glycine, ethanol, methanol and isopropyl alcohol; and glycine, ethanol, 1-propanol and isopropyl alcohol.

In the CMP polishing liquid of the third embodiment, the amino acid may be used in combination with the organic acid for a CMP polishing liquid of the second embodiment. When the organic acid and the amino acid are used in combination, the preferred combinations are lactic acid and glycine; malic acid and glycine; tartaric acid and glycine; and citric acid and glycine.

The property of the amino acid of inhibiting reduction of palladium ion to palladium metal can be determined by, for example, adding 5 mg of palladium acetate to 2.5 g of the organic solvent, 0.05 g of the amino acid and 2 g of water, stirring the mixture and allowing it to stand for 1 day, and then examining whether or not a black or white silver solid is produced. If the amino acid can prevent reduction of palladium ion, the precipitation amount of black or white silver palladium solid will be limited to not greater than 0.1 mg.

The amino acid content is preferably 0.01-20 mass % based on the total mass of the CMP polishing liquid. If the content is 0.01 mass % or greater, reduction of palladium ion by the organic solvent with reducing character will tend to be further inhibited. From this standpoint, the content is more preferably 0.02 mass % or greater and even more preferably 0.05 mass % or greater. The content of not greater than 20 mass % will tend to further inhibit reduction in the palladium polishing rate. From this standpoint, the content is more preferably not greater than 15 mass % and even more preferably not greater than 10 mass %.

(CMP Polishing Liquid Storage Method)

There are no particular restrictions on the method of storing the CMP polishing liquid of the first to third embodiments. For example, it may be stored as a one-pack polishing liquid containing all of the constituent components, or it may be stored as a concentrated one-pack polishing liquid with the water content reduced from the one-pack polishing liquid.

Also, the CMP polishing liquid may be stored as a polishing liquid wherein the constituent components of the polishing liquid are separated into at least a slurry (first liquid) and an additive liquid (second liquid), so that they are mixed together to obtain a CMP polishing liquid for each embodiment described above. It may also be stored as a polishing liquid composed of a concentrated slurry and a concentrated additive liquid with the water contents reduced from the aforementioned slurry and additive liquid. Storing the slurry and additive without mixing allows the storage stability of the CMP polishing liquid to be improved, and further minimizes reduction in polishing rate to allow polishing at a more stable polishing rate.

When the first embodiment is a two-pack polishing liquid, it is separated into, for example, a slurry containing an abrasive and an additive liquid containing phosphoric acid, 1,2,4-triazole and an organic solvent. When the first embodiment is a three-pack polishing liquid, it is separated into, for example, a slurry containing an abrasive, an additive liquid containing phosphoric acid and 1,2,4-triazole, and a liquid containing an organic solvent. When the CMP polishing liquid is a two-pack or three-pack polishing liquid, the oxidizing agent is added when the liquids are mixed. For the second and third embodiments, preferably, the slurry contains at least one kind selected from among amino acids and organic acids with no primary hydroxyl groups, and the additive liquid contains an organic solvent.

(Polishing Method)

By using each CMP polishing liquid explained above, it is possible to polish a substrate having a palladium layer on the side facing the polishing cloth. That is, a substrate polishing method is provided whereby a substrate is polished with a polishing cloth while supplying the CMP polishing liquid comprising at least an organic solvent, 1,2,4-triazole, a phosphorus acid compound, an oxidizing agent and an abrasive, between the substrate with a palladium layer and the polishing cloth.

When the polishing method is applied, preferably, the surface to be polished is polished by pressing the surface to be polished of the substrate against the polishing cloth of the polishing platen, and relatively moving the substrate with respect to the polishing platen, in a state that a prescribed pressure is applied to the back side of the substrate (the side opposite the surface to be polished), while supplying CMP polishing liquid between the surface to be polished and the polishing cloth.

When the CMP polishing liquid is a two-pack polishing liquid and the like, the substrate polishing method of this embodiment comprises a polishing liquid preparation step in which a slurry and additive liquid and the like are mixed to obtain a CMP polishing liquid, and a polishing step in which the surface to be polished of a substrate is polished using the obtained CMP polishing liquid by the polishing method described above.

The polishing apparatus may be, for example, a common polishing apparatus comprising a platen which is equipped with a motor having a variable rotational speed and allows attachment of a polishing cloth (pad), and a holder that holds the substrate. There are no particular restrictions on the polishing cloth, and a common nonwoven fabric, foamed polyurethane, porous fluorine resin or the like may be used. The polishing conditions are not particularly restricted, but the rotational speed of the platen is preferably low, at not higher than 200 rpm, to prevent fly off of the substrate.

The pressure on the substrate pressed against the polishing cloth (the polishing pressure) is preferably 4-100 kPa, and it is more preferably 6-60 kPa from the viewpoint of excellent uniformity within the substrate surface and flatness of the pattern. By using the CMP polishing liquid described above, it is possible to accomplish polishing of a palladium layer with a high polishing rate at a low polishing pressure. Polishing at a low polishing pressure is important from the viewpoint of preventing peeling, chipping, fragmentation and cracking of the polishing layer, and achieving flatness of the pattern.

During the polishing, the CMP polishing liquid is continuously supplied to the surface of the polishing cloth with a pump or the like. The amount supplied is not restricted, but preferably the surface of the polishing cloth is covered by the CMP polishing liquid at all times. Upon completion of polishing, preferably, the substrate is thoroughly rinsed in running water and a spin dryer or the like is used to remove the water droplets adhering to the substrate, and then drying is conducted.

The palladium layer to be polished may be any layer containing palladium. The palladium content of the palladium layer will usually be in the range of 40-100 mass % and is preferably in the range of 60-100 mass %, with respect to the total mass of the palladium layer.

Substrates that allow the effect of the CMP polishing liquid of this embodiment to be exhibited most prominently are substrates having a palladium layer. The CMP polishing liquid of this embodiment may be suitably used even for substrates having at least an insulating film layer, a nickel layer (a nickel-containing layer) and a palladium layer formed in that order on a semiconductor wafer such as silicon. An underlying metal layer may also be formed between the insulating film layer and the nickel layer.

The material used to form the palladium layer may be palladium, a palladium alloy, palladium compound or the like.

The material used to form the nickel layer may be nickel, a nickel alloy, nickel compound or the like.

The underlying metal layer is a layer that prevents diffusion of the conductive substance into the interlayer insulating film. The material used to form the underlying metal layer may be a tantalum compound such as tantalum, tantalum alloy or tantalum nitride; a titanium compound such as titanium, titanium alloy or titanium nitride; or a tungsten compound such as tungsten, tungsten nitride or tungsten alloy.

The insulating film layer may be a $SiO_2$ film, SiN film, SiON film or the like.

The polishing method using a CMP polishing liquid will now be explained in further detail with reference to the accompanying drawings. FIG. 1 is a cross-sectional view showing a first embodiment of the production method of a substrate with bump electrodes, wherein the polishing method described above is applied for part of the steps in this production method.

The substrate shown in FIG. 1(a) comprises a silicon substrate (silicon wafer) 1, an insulating film 2 formed on the silicon substrate 1 with concavoconvexities, and an under barrier metal layer 3 covering the irregular surface of the insulating film 2. The under barrier metal layer 3 corresponds to the palladium layer. The under barrier metal layer 3 of the substrate is polished using a CMP polishing liquid. Specifically, the substrate is polished with a polishing cloth, while supplying the CMP polishing liquid containing at least an organic solvent, 1,2,4-triazole, a phosphorus acid compound, an oxidizing agent and an abrasive between the under barrier metal layer 3 and the polishing cloth, to expose the convexities of the insulating film 2.

This polishing removes the under barrier metal layer 3 that has formed on the convexities of the insulating film 2. FIG. 1(b) is a cross-sectional view showing a substrate obtained by such polishing.

Next, a resist pattern 4 is formed on the convexities of the insulating film 2 from which the under barrier metal layer 3 has been removed, so that the under bather metal layer 3 formed on the concavities of the insulating film 2 is exposed. FIG. 1(c) is a cross-sectional view showing a substrate on which a resist pattern 4 has been formed.

Next, a method such as electric field plating is used to form bump electrodes 5 on the concavities of the substrate on which the resist pattern 4 has been formed, such that they protrude from the surface of the insulating film 2. FIG. 1(d) is a cross-sectional view showing a substrate on which bump electrodes 5 have been formed. Finally, the resist pattern 4 is removed to obtain a substrate which bump electrodes 5 have been formed on the silicon substrate 1. FIG. 1(e) is a cross-sectional view showing a substrate having bump electrodes obtained as described above. The bump electrodes 5 are usually formed using a material such as gold, silver, copper, nickel or solder.

Figure 2:
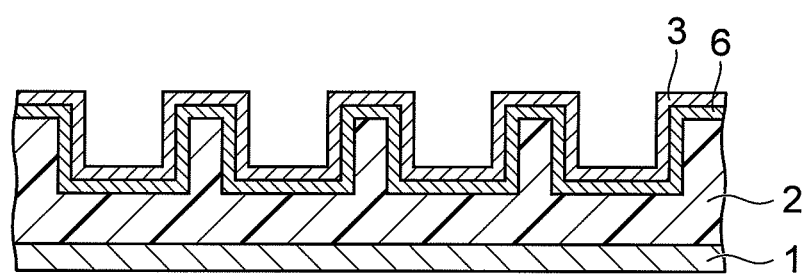
FIG. 2 is a cross-sectional view showing a second embodiment of a method for producing a substrate with bump electrodes.
Figure 2:
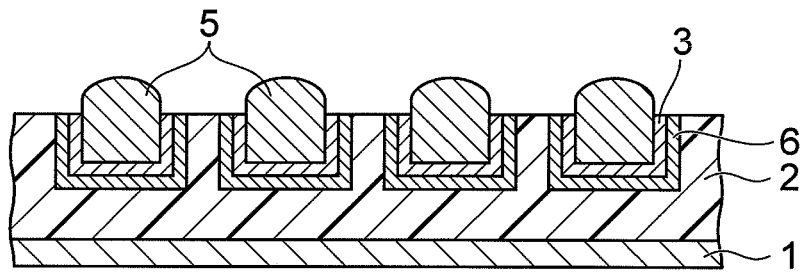

FIG. 2 is a cross-sectional view showing a second embodiment of the production method of a substrate with bump electrodes, wherein the polishing method described above is applied for part of the steps in this production method as well. FIG. 2 shows only the substrate before application of the polishing method (FIG. 2(a)) and the substrate with bump electrodes obtained as the final product (FIG. 2(b)), while the intervening steps of CMP polishing, resist pattern formation, bump electrode formation and resist pattern removal are cathed out in the same manner as the first embodiment.

The substrate shown in FIG. 2(a) comprises a silicon substrate 1, an insulating film 2 formed on the silicon substrate 1 with concavoconvexities, an underlying metal layer 6 covering the irregular surface of the insulating film 2, and an under barrier metal layer 3 formed on the underlying metal layer 6. The under barrier metal layer 3 corresponds to the palladium layer. Formation of the underlying metal layer 6 is accomplished for the purpose of inhibiting diffusion of the components of the under barrier metal layer 3 into the silicon substrate 1, and increasing adhesiveness between the silicon substrate 1 and the under barrier metal layer 3.

The under barrier metal layer 3 and underlying metal layer 6 of the substrate are polished using the CMP polishing liquid. Specifically, the substrate is polished with a polishing cloth, while supplying the CMP polishing liquid containing at least an organic solvent, 1,2,4-triazole, a phosphorus acid compound an oxidizing agent and an abrasive between the under barrier metal layer 3 and the polishing cloth, to expose the convexities of the insulating film 2. This polishing removes the under barrier metal layer 3 and underlying metal layer 6 that have been formed on the convexities of the insulating film 2. Also, by conducting resist pattern formation, bump electrode formation and resist pattern removal on the substrate obtained in this manner, as in the first embodiment, it is possible to obtain a substrate having bump electrodes 5 formed on the silicon substrate 1, as shown in FIG. 2(b).

Figure 3:
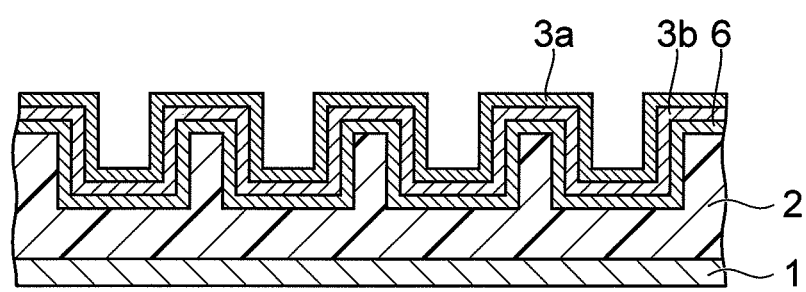
FIG. 3 is a cross-sectional view showing a third embodiment of a method for producing a substrate with bump electrodes.
Figure 3:
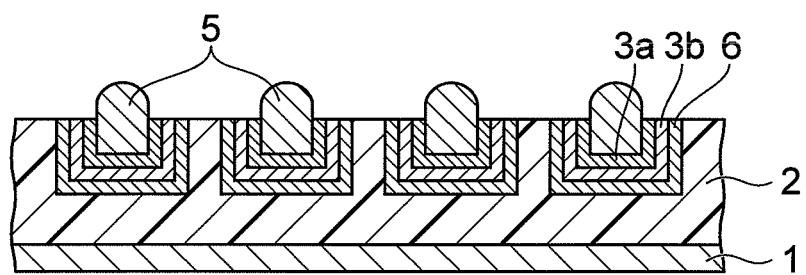

FIG. 3 is a cross-sectional view showing a third embodiment of the production method of a substrate with bump electrodes, wherein the polishing method described above is applied for part of the steps in this production method as well. FIG. 3 shows only the substrate before application of the polishing method (FIG. 3(a)) and the substrate with bump electrodes obtained as the final product (FIG. 3(b)), while the intervening steps of CMP polishing, resist pattern formation, bump electrode formation and resist pattern removal are carried out in the same manner as the first embodiment.

The substrate shown in FIG. 3(a) comprises a silicon substrate 1, an insulating film 2 formed on the silicon substrate 1 with concavoconvexities, an underlying metal layer 6 covering the irregular surface of the insulating film 2, a first under barrier metal layer 3b formed on the underlying metal layer 6, and a second under barrier metal layer 3a formed on the first under barrier metal layer 3b. The first under barrier metal layer 3b or second under barrier metal layer 3a corresponds to the palladium layer.

The first under barrier metal layer 3b, second under barrier metal layer 3a and underlying metal layer 6 of the substrate are polished using a CMP polishing liquid. Specifically, the substrate is polished with a polishing cloth, while supplying the CMP polishing liquid containing at least an organic solvent, 1,2,4-triazole, a phosphorus acid compound, an oxidizing agent and an abrasive between the second under barrier metal layer 3a and the polishing cloth, to expose the convexities of the insulating film 2. This polishing removes the first under barrier metal layer 3b, second under barrier metal layer 3a and underlying metal layer 6 that have been formed on the convexities of the insulating film 2. Also, by conducting resist pattern formation, bump electrode formation and resist pattern removal on the substrate obtained in this manner, as in the first embodiment, it is possible to obtain a substrate having bump electrodes 5 formed on the silicon substrate 1, as shown in FIG. 3(b).

Figure 4:
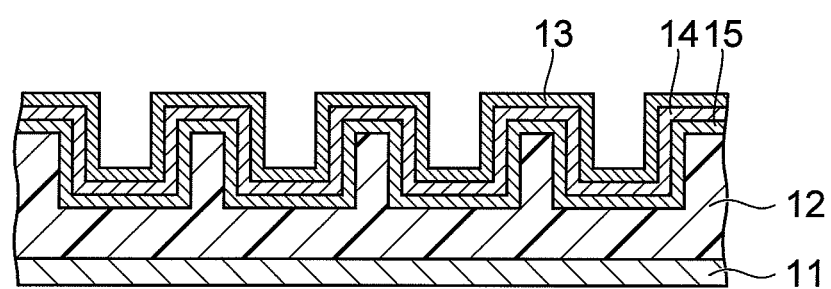
FIG. 4 is a cross-sectional view of a specific example of a third embodiment of a method for producing a substrate with bump electrodes.
Figure 4:
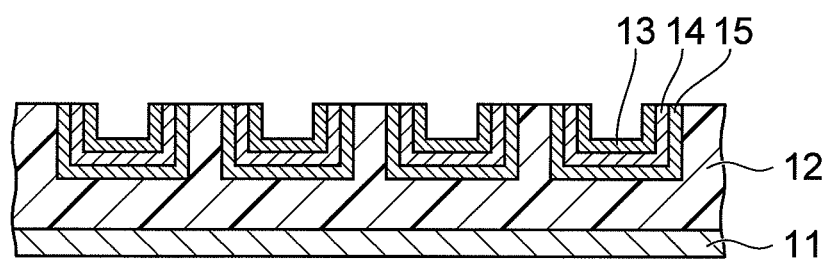

FIG. 4 shows an example wherein the first under barrier metal layer 3b is a nickel layer and the second under barrier metal layer 3a is a palladium layer in FIG. 3 (a structure comprising two under barrier metal layers).

The substrate shown in FIG. 4(a) has an underlying metal layer 15, a nickel layer 14 and a palladium layer 13 formed in that order on the concavoconvex sections of the insulating film 12 provided on the silicon substrate 11. A CMP polishing liquid may be used for polishing of the palladium layer 13, nickel layer 14 and underlying metal layer 15, for exposure of the convexities of the insulating film 12, as shown in FIG. 4(b).

Another example of a polishing method using a CMP polishing liquid is a method comprising a first polishing step in which the palladium layer 13 present on the convexities of the insulating film 12 is polished to expose the nickel layer 14, and a second polishing step in which the nickel layer 14 and underlying metal layer 15 present on the convexities of the insulating film 12, and a portion of the palladium layer 13 filling the concavities of the insulating film 12, are polished to expose the convexities of the insulating film 12, wherein the CMP polishing liquid is used in at least the first polishing step of the two polishing steps.

EXAMPLES

The present invention will now be explained by examples. However, the invention is not limited to these examples.

Examples 1-8, Comparative Example 1

For Examples 1-8 and Comparative Example 1, 5 mg of palladium acetate was added to and stirred with 5 g of the solvent listed in Table 1, and observation was made of the palladium acetate solubility and the presence or absence of precipitation of a black deposit after the palladium acetate-dissolved solution had stood for 1 day at room temperature. The results of observing the palladium acetate solubility and the presence or absence of precipitation of a black deposit are shown in Table 1. The palladium acetate solubility was evaluated as "A" if the palladium acetate completely dissolved, or "B" if it did not. The presence or absence of precipitation of a black deposit was evaluated as "Yes" if the amount of precipitate exceeded 0.1 mg.

Also, 10 g of the organic solvent was added to 10 g of purified water to evaluate the compatibility between the organic solvent and water. In Table 1, "A" indicates that the organic solvent and water were compatible, and "B" indicates that they were not.

TABLE 1

| | Solvent | Palladium acetate solubility | Presence of black deposit | Compatibility with water |
|---|---|---|---|---|
| Example 1 | Isopropyl alcohol | A | Yes | A |
| Example 2 | Methanol | A | Yes | A |
| Example 3 | Ethanol | A | Yes | A |
| Example 4 | Propylene glycol | A | Yes | A |
| Example 5 | Propyleneglycol monomethyl ether | A | Yes | A |
| Example 6 | Ethyl lactate | A | No | A |
| Example 7 | Ethyl acetate | A | No | A |
| Example 8 | Cyclohexane | A | No | B |
| Comp. Ex. 1 | Water | B | — | — |

The results shown in Table 1 will now be explained. Isopropyl alcohol was used as the organic solvent in Example 1. In Example 1, the palladium acetate dissolved when added to the solvent, unlike Comparative Example 1. However, a black deposit was observed to be produced after 1 day. The isopropyl alcohol was also compatible with an equal mass of water.

Methanol was used as the organic solvent in Example 2. In Example 2, the palladium acetate dissolved when added to the solvent, unlike Comparative Example 1. However, a black deposit was observed to be produced after 1 day. The methanol was also compatible with an equal mass of water.

Ethanol was used as the organic solvent in Example 3. In Example 3, the palladium acetate dissolved when added to the solvent, unlike Comparative Example 1. However, a black deposit was observed to be produced after 1 day. The ethanol was also compatible with an equal mass of water.

Propylene glycol was used as the organic solvent in Example 4. In Example 4, the palladium acetate dissolved when added to the solvent, unlike Comparative Example 1. However, a black deposit was observed to be produced after 1 day. The propylene glycol was also compatible with an equal mass of water.

Propyleneglycol monomethyl ether was used as the organic solvent in Example 5. In Example 5, the palladium acetate dissolved when added to the solvent, unlike Comparative Example 1. However, a black deposit was observed to be produced after 1 day. The propyleneglycol monomethyl ether was also compatible with an equal mass of water.

Ethyl lactate was used as the organic solvent in Example 6. In Example 6, the palladium acetate dissolved when added to the solvent, unlike Comparative Example 1. Also, no black deposit was produced when the solution was observed after 1 day. The ethyl lactate was also compatible with an equal mass of water.

Ethyl acetate was used as the organic solvent in Example 7. In Example 7, the palladium acetate dissolved when added to the solvent, unlike Comparative Example 1. Also, no black deposit was produced when the solution was observed after 1 day. The ethyl acetate was also compatible with an equal mass of water.

Cyclohexane was used as the organic solvent in Example 8. In Example 8, the palladium acetate dissolved when added to the solvent, unlike Comparative Example 1. Also, no black deposit was produced when the solution was observed after 1 day. However, the cyclohexane was not compatible with an equal mass of water.

Examples 9-29

For Examples 9 to 29, an acid in the amount listed in Table 2 was dissolved in 2.0 g of purified water, 2.5 g of the organic solvent listed in Table 2 was mixed therewith and 5 mg of palladium acetate was added to the mixed solution and stirred therewith, then observation was made of the solubility of the palladium acetate and the presence or absence of precipitation of a black deposit after the palladium acetate-dissolved solution had stood for 1 day at room temperature. Table 2 shows the results of observing the presence or absence of precipitation of a black deposit. This was evaluated as "Yes" if the amount of precipitate exceeded 0.1 mg.

TABLE 2

| | Acid | Organic solvent | Presence of black deposit |
|---|---|---|---|
| Example 9 | — | Isopropyl alcohol | Yes |
| Example 10 | — | Methanol | Yes |
| Example 11 | — | Ethanol | Yes |
| Example 12 | Glycolic acid (2.0 g) | Ethanol | Yes |

TABLE 2-continued

|  | Acid | Organic solvent | Presence of black deposit |
|---|---|---|---|
| Example 13 | Gluconic acid (2.0 g) | Ethanol | Yes |
| Example 14 | Nitric acid (0.5 g) | Ethanol | Yes |
| Example 15 | Citric acid (0.5 g) | Methanol | No |
| Example 16 | Malic acid (0.5 g) | Ethyleneglycol monomethyl ether | No |
| Example 17 | Lactic acid (0.5 g) | Isopropyl alcohol | No |
| Example 18 | Tartaric acid (0.5 g) | Ethanol | No |
| Example 19 | Maleic acid (0.5 g) | Ethanol | No |
| Example 20 | Malic acid (0.5 g) | Ethanol | No |
| Example 21 | Mandelic acid (0.1 g) | Ethanol | No |
| Example 22 | Lactic acid (0.5 g) | Ethanol | No |
| Example 23 | Citric acid (0.5 g) | Ethanol | No |
| Example 24 | Glycine (0.05 g) | Ethanol | No |
| Example 25 | Alanine (0.05 g) | Ethanol | No |
| Example 26 | Arginine (0.05 g) | Ethanol | No |
| Example 27 | Histidine (0.05 g) | Eihanol | No |
| Example 28 | Serine (0.05 g) | Ethanol | No |
| Example 29 | Glycine (0.05 g) Lactic acid (1.0 g) | Ethanol | No |

The results shown in Table 2 will now be explained. Isopropyl alcohol was used as the organic solvent in Example 9. In Example 9, similar to Examples 1-5, a black deposit was produced when palladium acetate was added to and dissolved in the solution and the solution was observed after 1 day.

Methanol was used as the organic solvent in Example 10. In Example 10, similar to Examples 1-5, a black deposit was produced when palladium acetate was added to and dissolved in the solution and the solution was observed after 1 day.

Ethanol was used as the organic solvent in Example 11. In Example 11, similar to Examples 1-5, a black deposit was produced when palladium acetate was added to and dissolved in the solution and the solution was observed after 1 day.

For Example 12, 2.0 g of glycolic acid was used as the organic acid, and ethanol was used as the organic solvent. In Example 12, similar to Examples 1-5, a black deposit was produced when palladium acetate was added to and dissolved in the solution and the solution was observed after 1 day.

For Example 13, 2.0 g of gluconic acid was used as the organic acid, and ethanol was used as the organic solvent. In Example 13, similar to Examples 1-5, a black deposit was produced when palladium acetate was added to and dissolved in the solution and the solution was observed after 1 day.

For Example 14, 0.5 g of nitric, acid was used as the acid, and ethanol was used as the organic solvent. In Example 14, similar to Examples 1-5, a black deposit was produced when palladium acetate was added to and dissolved in the solution and the solution was observed after 1 day.

For Example 15, 0.5 g of citric acid was used as the organic acid, and methanol was used as the organic solvent. In Example 15, similar to Examples 6-8, no black deposit was produced even when palladium acetate was added to and dissolved in the solution and the solution was observed after 1 day.

For Example 16, 0.5 g of malic acid was used as the organic acid, and ethyleneglycol monomethyl ether was used as the organic solvent. In Example 16, similar to Examples 6-8, no black deposit was produced even when palladium acetate was added to and dissolved in the solution and the solution was observed after 1 day.

For Example 17, 0.5 g of lactic acid was used as the organic acid, and isopropyl alcohol was used as the organic solvent. In Example 17, similar to Examples 6-8, no black deposit was produced even when palladium acetate was added to and dissolved in the solution and the solution was observed after 1 day.

For Example 18, 0.5 g of tartaric acid was used as the organic acid, and ethanol was used as the organic solvent. In Example 18, similar to Examples 6-8, no black deposit was produced even when palladium acetate was added to and dissolved in the solution and the solution was observed after 1 day.

For Example 19, 0.5 g of maleic acid was used as the organic acid, and ethanol was used is the organic solvent. In Example 19, similar to Examples 6-8, no black deposit was produced even when palladium acetate was added to and dissolved in the solution and the solution was observed after 1 day.

For Example 20, 0.5 g of malic acid was used as the organic acid, and ethanol was used as the organic solvent. In Example 20, similar to Examples 6-8, no black deposit was produced even when palladium acetate was added to and dissolved in the solution and the solution was observed after 1 day.

For Example 21, 0.1 g of mandelic acid was used as the organic acid, and ethanol was used as the organic solvent. In Example 21, similar to Examples 6-8, no black deposit was produced even when palladium acetate was added to and dissolved in the solution and the solution was observed after 1 day.

For Example 22, 0.5 g of lactic acid was used as the organic acid, and ethanol was used as the organic solvent. In Example 22, similar to Examples 6-8, no black deposit was produced even when palladium acetate was added to and dissolved in the solution and the solution was observed after 1 day.

For Example 23, 0.5 g of citric acid was used as the organic acid, and ethanol was used as the organic solvent. In Example 23, similar to Examples 6-8, no black deposit was produced even when palladium acetate was added to and dissolved in the solution and the solution was observed after 1 day.

For Example 24, 0.05 g of glycine was used as the amino acid, and ethanol was used as the organic solvent. In Example 24, similar to Examples 6-8, no black deposit was produced even when palladium acetate was added to and dissolved in the solution and the solution was observed after 1 day.

For Example 25, 0.05 g of alanine was used as the amino acid, and ethanol was used as the organic solvent. In Example 25, similar to Examples 6-8, no black deposit was produced even when palladium acetate was added to and dissolved in the solution and the solution was observed after 1 day.

For Example 26, 0.05 g of arginine was used as the amino acid, and ethanol was used as the organic solvent. In Example 26, similar to Examples 6-8, no black deposit was produced even when palladium acetate was added to and dissolved in the solution and the solution was observed after 1 day.

For Example 27, 0.05 g of histidine was used as the amino acid, and ethanol was used as the organic solvent. In Example 27, similar to Examples 6-8, no black deposit was produced even when palladium acetate was added to and dissolved in the solution and the solution was observed after 1 day.

For Example 28, 0.05 g of serine was used as the amino acid, and ethanol was used as the organic solvent. In Example 28, similar to Examples 6-8, no black deposit was produced even when palladium acetate was added to and dissolved in the solution and the solution was observed after 1 day.

For Example 29, 1.0 g of lactic acid was used as the organic acid, 0.05 g of glycine was used as the amino acid, and ethanol was used as the organic solvent. In Example 29, similar to Examples 6-8, no black deposit was produced even when palladium acetate was added to and dissolved in the solution and the solution was observed after 1 day.

Examples 30-42, Comparative Examples 2-8

CMP Polishing Liquid Preparation Method

The CMP polishing liquids used in Examples 30-42 and Comparative Examples 2-8 were prepared so that the CMP polishing liquids contain 10 mass % of colloidal silica (mean secondary particle size: 43 nm) as the abrasive, 0-5.0 mass % of the organic solvents listed in Tables 3 and 4, 0-5.0 mass % of the organic acids or amino acids listed in Tables 3 and 4, 10 mass % of 30% hydrogen peroxide water as an oxidizing agent, 0-5.0 mass % of the metal oxide solubilizers listed in Tables 3 and 4, 0-0.5 mass % of the complexing agents listed in Tables 3 and 4, based on the total mass of the CMP polishing liquid, and purified water as the remainder. Each polishing liquid was prepared by dissolving the components other than the abrasive in the purified water, and then mixing and stirring the abrasive therewith. The CMP polishing liquids were used for continuous polishing of substrates to be polished under the following polishing conditions.

(Liquid Property Evaluation: pH Measurement)
Measuring temperature: 25±5° C.
pH: Measured using a Model PHL-40 by DKK Corp.
(CMP Polishing Conditions)
Polishing apparatus: Mirra (Applied Materials)
CMP polishing liquid flow rate: 200 mL/min
Substrate to be polished: Silicon substrate with 0.3 μm-thick layer formed by sputtering
Polishing cloth: Foamed polyurethane resin with closed pores (Model IC1000, Rohm & Haas, Japan).
Polishing pressure: 29.4 kPa (4 psi)
Relative speed between substrate and polishing platen: 36 m/min
Polishing time: 1 minute each
Cleaning: CMP treatment was followed by cleaning with ultrasonic water and drying with a spin dryer.
Continuous polishing number: 5 or 100
(Polished Product Evaluation: Polishing Rate)

The polishing rate (PdRR) for the palladium layer that had been polished and cleaned under the aforementioned conditions was determined on the basis of the difference in film thickness before and after polishing obtained by converting the electrical resistance value, according to the following formula.

(PdRR)=(Difference in thickness of palladium layer (nm) before and after polishing)/(polishing time (min))

Tables 3 and 4 show the pH value of each of the CMP polishing liquids of Examples 30-42 and Comparative Examples 2-8, the palladium layer polishing rate (PdRR) for the 1st, 5th and 100th substrates, and the reduction ratio of the palladium polishing rate for the 5th or 100th substrate to the palladium polishing rate for the 1st substrate. The symbol "—" is listed in the table for cases where the PdRR for the 100th substrate was unmeasured.

TABLE 3

| | Metal oxide solubilizer (mass %) | Complexing agent (mass %) | Organic solvent (mass %) | Amino acid or organic acid (mass %) | pH | PdRR (nm/min) 1st substrate | 5th substrate | 100th substrate | Reduction ratio of polishing rate (%) |
|---|---|---|---|---|---|---|---|---|---|
| Example 30 | Phosphoric acid (5.0) | 1,2,4-Triazole (0.5) | Isopropyl alcohol (5.0) | — | 1.5 | 50 | 50 | 47 | 0/6 |
| Example 31 | Phosphoric acid (5.0) | 1,2,4-Triazole (0.5) | Propylene glycol monopropyl ether (5.0) | — | 1.5 | 48 | 48 | — | 0/— |
| Example 32 | Phosphoric acid (5.0) | 1,2,4-Triazole (0.5) | Propylene glycol monomethyl ether (5.0) | — | 1.5 | 43 | 42 | 40 | 2/7 |
| Example 33 | Phosphoric acid (5.0) | 1,2,4-Triazole (0.5) | Propylene carbonate (5.0) | — | 1.5 | 41 | 40 | — | 2/— |
| Example 34 | Phosphoric acid (5.0) | 1,2,4-Triazole (0.5) | Ethyl lactate (5.0) | — | 1.5 | 60 | 61 | 60 | 0/0 |
| Example 35 | Phosphoric acid (5.0) | 1,2,4-Triazole (0.5) | Ethyl acetate (5.0) | — | 1.5 | 57 | 57 | 58 | 0/0 |
| Example 36 | Phosphoric acid (5.0) | 1,2,4-Triazole (0.5) | Ethanol (2.5) | Lactic acid (1.0) | 1.5 | 50 | 49 | — | 2/— |
| Example 37 | Phosphoric acid (5.0) | 1,2,4-Triazole (0.5) | Ethanol (2.5) | Lactic acid (2.5) | 1.5 | 45 | 44 | 45 | 2/0 |
| Example 38 | Phosphoric acid (5.0) | 1,2,4-Triazole (0.5) | Ethanol (2.5) | Lactic acid (5.0) | 1.5 | 40 | 41 | — | 0/— |
| Example 39 | Phosphoric acid (5.0) | 1,2,4-Triazole (0.5) | Ethanol (5.0) | Lactic acid (2.5) | 1.5 | 42 | 43 | — | 0/— |
| Example 40 | Phosphoric acid (5.0) | 1,2,4-Triazole (0.5) | Ethanol (2.5) | Malic acid (2.5) | 1.5 | 47 | 47 | — | 0/— |
| Example 41 | Phosphoric acid (5.0) | 1,2,4-Triazole (0.5) | Ethanol (2.5) | Citric acid (2.5) | 1.5 | 44 | 45 | — | 0/— |
| Example 42 | Phosphoric acid (5.0) | 1,2,4-Triazole (0.5) | Ethanol (2.5) | Glycine (2.5) | 2.0 | 48 | 48 | — | 0/— |

TABLE 4

| | Metal oxide solubilizer (mass %) | Complexing agent (mass %) | Organic solvent (mass %) | Amino acid or organic acid (mass %) | pH | PdRR (nm/min) 1st substrate | 5th substrate | 100th substrate | Reduction ratio of polishing rate (%) |
|---|---|---|---|---|---|---|---|---|---|
| Comp. Ex. 2 | Phosphoric acid (5.0) | 1,2,4-Triazole (0.5) | — | — | 1.5 | 61 | 53 | 35 | 13/43 |
| Comp. Ex. 3 | Oxalic acid (5.0) | — | — | — | 1.1 | 2.2 | 2.4 | — | 0/— |
| Comp. Ex. 4 | Glycolic acid (5.0) | — | — | — | 2.0 | 1.6 | 1.5 | — | 6/— |
| Comp. Ex. 5 | Phosphoric acid (5.0) | — | — | — | 1.4 | 4.4 | 4.0 | — | 9/— |
| Comp. Ex. 6 | — | 1,2,4-Triazole (0.5) | — | — | 6.5 | 0.2 | 0.2 | — | 0/— |
| Comp. Ex. 7 | Phosphoric acid (5.0) | 1,2,3-Triazole (0.5) | — | — | 1.5 | 0 | 0 | — | 0/— |
| Comp. Ex. 8 | Glycolic acid (5.0) | 1,2,4-Triazole (0.5) | Isopropyl alcohol (5.0) | — | 2.8 | 4.8 | 5.1 | — | 0/— |

The results shown in Tables 3 and 4 will now be explained in detail. For Example 30, the CMP polishing liquid was prepared using 5.0 mass % of isopropyl alcohol as the organic solvent and 5.0 mass % of phosphoric acid as the metal oxide solubilizer. In Example 30, the palladium polishing rate for the 1st substrate was 50 nm/min, which was higher than in Comparative Examples 3-8, while the reduction ratios of the palladium polishing rate for the 5th and 100th substrates to the palladium polishing rate for the 1st substrate were 0% and 6% respectively, which were lower than in Comparative Example 2.

For Example 31, the CMP polishing liquid was prepared using 5.0 mass % of propyleneglycol monopropyl ether as the organic solvent and 5.0 mass % of phosphoric acid as the metal oxide solubilizer. In Example 31, the palladium polishing rate for the 1st substrate was 48 nm/min, which was higher than in Comparative Examples 3-8, while the reduction ratio of the palladium polishing rate was 0%, which was lower than in Comparative Example 2.

For Example 32, the CMP polishing liquid was prepared using 5.0 mass % of propyleneglycol monomethyl ether as the organic solvent and 5.0 mass % of phosphoric acid as the metal oxide solubilizer. In Example 32, the palladium polishing rate for the 1st substrate was 43 nm/min, which was higher than in Comparative Examples 3-8, while the reduction ratios of the palladium polishing rate were 2% and 7%, respectively, which were lower than in Comparative Example 2.

For Example 33, the CMP polishing liquid was prepared using 5.0 mass % of propylene carbonate as the organic solvent and 5.0 mass % of phosphoric acid as the metal oxide solubilizer. In Example 33, the palladium polishing rate for the 1st substrate was 41 nm/min, which was higher than in Comparative Examples 3-8, while the reduction ratio of the palladium polishing rate was 2%, which was lower than in Comparative Example 2.

For Example 34, the CMP polishing liquid was prepared using 5.0 mass % of ethyl lactate as the organic solvent and 5.0 mass % of phosphoric acid as the metal oxide solubilizer. In Example 34, the palladium polishing rate for the 1st substrate was 60 nm/min, which was higher than in Comparative Examples 3-8, while the reduction ratios of the palladium polishing rate were both 0%, which were lower than in Comparative Example 2.

For Example 35, the CMP polishing liquid was prepared using 5.0 mass % of ethyl acetate as the organic solvent and 5.0 mass % of phosphoric acid as the metal oxide solubilizer.

In Example 35, the palladium polishing rate for the 1st substrate was 57 nm/min, which was higher than in Comparative Examples 3-8, while the reduction ratios of the palladium polishing rate were both 0%, which were lower than in Comparative Example 2.

For Example 36, the CMP polishing liquid was prepared using 2.5 mass % of ethanol as the organic solvent, 1.0 mass % of the organic acid, and 5.0 mass % of phosphoric acid as the metal oxide solubilizer. In Example 36, the palladium polishing rate for the 1st substrate was 50 nm/min, which was higher than in Comparative Examples 3-8, while the reduction ratio of the palladium polishing rate was 2%, which was lower than in Comparative Example 2.

For Example 37, the CMP polishing liquid was prepared using 2.5 mass % of ethanol as the organic solvent, 2.5 mass % of the organic acid, and 5.0 mass % of phosphoric acid as the metal oxide solubilizer. In Example 37, the palladium polishing rate for the 1st substrate was 45 nm/min, which was higher than in Comparative Examples 3-8, while the reduction ratios of the palladium polishing rate were 2% and 0%, respectively, which were lower than in Comparative Example 2.

For Example 38, the CMP polishing liquid was prepared using 2.5 mass % of ethanol as the organic solvent, 5.0 mass % of the organic acid, and 5.0 mass % of phosphoric acid as the metal oxide solubilizer. In Example 38, the palladium polishing rate for the 1st substrate was 40 nm/min, which was higher than in Comparative Examples 3-8, while the reduction ratio of the palladium polishing rate was 0%, which was lower than in Comparative Example 2.

For Example 39, the CMP polishing liquid was prepared using 5.0 mass % of ethanol as the organic solvent, 2.5 mass % of the organic acid and 5.0 mass % of phosphoric acid as the metal oxide solubilizer. In Example 39, the palladium polishing rate for the 1st substrate was 42 nm/min, which was higher than in Comparative Examples 3-7, while the reduction ratio of the palladium polishing rate was 0%, which was lower than in Comparative Example 2.

For Example 40, the CMP polishing liquid was prepared using 2.5 mass % of ethanol as the organic solvent, 2.5 mass % of the organic acid, and 5.0 mass % of phosphoric acid as the metal oxide solubilizer. In Example 40, the palladium polishing rate for the 1st substrate was 47 nm/min, which was higher than in Comparative Examples 3-7, while the reduction ratio of the palladium polishing rate was 0%, which was lower than in Comparative Example 2.

For Example 41, the CMP polishing liquid was prepared using 2.5 mass % of ethanol as the organic solvent, 2.5 mass % of the organic acid, and 5.0 mass % of phosphoric acid as the metal oxide solubilizer. In Example 41, the palladium polishing rate for the 1st substrate was 44 nm/min, which was higher than in Comparative Examples 3-7, while the reduction ratio of the palladium polishing rate was 0%, which was lower than in Comparative Example 2.

For Example 42, the CMP polishing liquid was prepared using 2.5 mass % of ethanol as the organic solvent, 2.5 mass % of the amino acid, and 5.0 mass % of phosphoric acid as the metal oxide solubilizer. In Example 42, the palladium polishing rate for the 1st substrate was 48 nm/min, which was higher than in Comparative Examples 3-7, while the reduction ratio of the palladium polishing rate was 0%, which was lower than in Comparative Example 2.

In Comparative Examples 5 and 7, the CMP polishing liquid contained phosphoric acid as the metal oxide solubilizer, but the polishing rate was extremely low. However, the polishing rate was significantly increased by including 1,2,4-triazole as a complexing agent in the CMP polishing liquid in addition to the phosphoric acid as in Comparative Example 2. However, the reduction ratio of the palladium polishing rate in Comparative Example 2 was very large. In Examples 30-35, on the other hand, adding an organic solvent in addition to the phosphoric acid and 1,2,4-triazole used in Comparative Example 2 allowed the reduction ratio of the palladium polishing rate to be greatly reduced while maintaining a high palladium polishing rate.

In addition, polishing proceeded when the CMP polishing liquid of Example 30 was used for polishing of a nickel layer-formed silicon substrate and a tantalum nitride layer-formed silicon substrate. Thus, the CMP polishing liquid of the invention can be used for the steps of polishing a substrate comprising a palladium layer 13, nickel layer 14 and underlying metal layer 15 as shown in FIG. 4(*a*), to obtain the structure shown in FIG. 4(*b*).

REFERENCE SIGNS LIST

1, 11: Silicon substrates, 2, 12: insulating films, 3: under barrier metal layer, 3*a*: second under barrier metal layer, 3*b*: first under barrier metal layer, 4: resist pattern, 5: bump electrode, 6, 15: underlying metal layers, 13: palladium layer, 14: nickel layer.

The invention claimed is:

1. A polishing method for a substrate, the method comprising:
   polishing a palladium layer on a substrate with a polishing cloth while supplying a CMP polishing liquid between the substrate and the polishing cloth, wherein:
   the CMP polishing liquid comprises an organic solvent, 1,2,4-triazole in an amount ranging from 0.01 to 20 mass %, phosphoric acid in an amount ranging from 0.001 to 20 mass %, hydrogen peroxide in an amount ranging from 0.05 to 20 mass %, and an abrasive, all amounts being based on a total mass of the CMP polishing liquid, and the organic solvent comprises at least one kind selected from among an alcohol, a carbonic acid ester, a carboxylic acid ester and a glycol derivative.

2. The polishing method according to claim 1, wherein the organic solvent comprises a reducing organic solvent, and the CMP polishing liquid further comprises at least one kind selected from among an amino acid and an organic acid with no primary hydroxyl groups.

3. The polishing method according to claim 2, wherein the organic acid comprises a carboxylic acid.

4. The polishing method according to claim 2, wherein the amino acid comprises at least one kind selected from among glycine, alanine, arginine, isoleucine, leucine, valine, phenylalanine, asparagine, glutamine, lysine, histidine, proline, tryptophan, aspartic acid, glutamic acid, serine, threonine, tyrosine, cysteine, methionine, and derivatives of the foregoing.

5. The polishing method according to claim 1, wherein the abrasive comprises at least one kind selected from among alumina, silica, zirconia, titania and ceria, as the abrasive.

6. The polishing method according to claim 1, wherein the CMP polishing liquid further comprises a water-soluble polymer.

7. The polishing method according to claim 6, wherein the water-soluble polymer has a weight-average molecular weight of at least 500.

8. The polishing method according to claim 1, wherein the CMP polishing liquid comprises the organic solvent in an amount ranging from 0.1 to 95 mass % based on the total mass of the CMP polishing liquid.

9. The polishing method according to claim 8, wherein the CMP polishing liquid comprises the abrasive in an amount ranging from 0.1 to 10 mass % based on the total mass of the CMP polishing liquid.

10. The polishing method according to claim 9, wherein the CMP polishing liquid has a pH ranging from 1 to 6.

11. The polishing method according to claim 1, wherein the organic solvent is included in the amount so as to dissolve palladium-containing compounds in the organic solvent and avoid their adhesion onto the polishing cloth.

12. A polishing method for a substrate, the method comprising: polishing a palladium layer on a substrate with a polishing cloth while supplying a CMP polishing liquid between the substrate and the polishing cloth, wherein:
   the CMP polishing liquid comprises an organic solvent, an organic acid with no primary hydroxyl group in an amount ranging from 0.1 to 20 mass %, 1,2,4-triazole in an amount ranging from 0.01 to 20 mass %, phosphoric acid in an amount ranging from 0.001 to 20 mass %, hydrogen peroxide in an amount ranging from 0.05 to 20 mass %, and an abrasive, all amounts being based on a total mass of the CMP polishing liquid, and the organic solvent comprises at least one kind selected from among a glycol, a glycol derivative and an alcohol.

13. The polishing method according to claim 12, wherein the organic acid comprises a carboxylic acid.

14. The polishing method according to claim 12, wherein the abrasive comprises at least one kind selected from among alumina, silica, zirconia, titania and ceria, as the abrasive.

15. The polishing method according to claim 12, wherein the CMP polishing liquid comprises the organic solvent in an amount ranging from 0.1 to 95 based on the total mass of the CMP polishing liquid.

16. The polishing method according to claim 15, wherein the CMP polishing liquid comprises the abrasive in an amount ranging from 0.1 to 10 mass % based on the total mass of the CMP polishing liquid.

17. The polishing method according to claim 16, wherein the CMP polishing liquid has a pH ranging from 1 to 6.

18. The polishing method according to claim 12, wherein the organic solvent is included in the amount so as to dissolve palladium-containing compounds in the organic solvent and avoid their adhesion onto the polishing cloth.

* * * * *